(12) United States Patent
Prall et al.

(10) Patent No.: US 6,406,998 B1
(45) Date of Patent: Jun. 18, 2002

(54) FORMATION OF SILICIDED CONTACT BY ION IMPLANTATION

(75) Inventors: Kirk D. Prall; Gurtej S. Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 784 days.

(21) Appl. No.: 08/596,613

(22) Filed: Feb. 5, 1996

(51) Int. Cl.$^7$ .................. H01L 21/44; H01L 21/461
(52) U.S. Cl. .................. 438/659; 438/660; 438/664; 438/668; 438/672; 438/675; 438/692; 438/745; 438/756
(58) Field of Search .................. 437/24, 50, 192, 437/195, 200

(56) References Cited

U.S. PATENT DOCUMENTS

| | | | | |
|---|---|---|---|---|
| 4,936,950 A | * | 6/1990 | Doan et al. ............ | 437/192 |
| 5,164,330 A | * | 11/1992 | Davis et al. ........... | 437/192 |
| 5,202,280 A | * | 4/1993 | Kamiyama et al. ...... | 437/24 |
| 5,244,534 A | * | 9/1993 | Yu et al. .............. | 437/195 |
| 5,354,381 A | * | 10/1994 | Sheng ................. | 118/723 E |
| 5,482,894 A | * | 1/1996 | Havemann ............. | 437/195 |

FOREIGN PATENT DOCUMENTS

| | | | |
|---|---|---|---|
| JP | 02-228030 | * | 9/1990 |
| JP | 06-140358 | * | 5/1994 |
| JP | 08-064552 | * | 3/1996 |

* cited by examiner

*Primary Examiner*—Ha Tran Nguyen
(74) *Attorney, Agent, or Firm*—Workman, Nydegger & Seeley

(57) ABSTRACT

Disclosed is a method using the implantation of ionized titanium for the formation of an electrical contact having a metal silicide diffusion barrier. The electrical contact is created by the steps of etching a contact opening over an active region on an in-process integrated circuit wafer, implanting metal ions into the contact opening, and annealing the contact opening to form a titanium silicide layer at the bottom of the contact opening adjacent to the underlying active region. In a further step, a titanium nitride layer is formed on the surface of the contact opening above the metal silicide layer, and the remainder of the contact opening is then filled by depositing tungsten into the contact opening. The method is especially useful for forming contacts having a high aspect ratio and for forming self-aligned contacts as it is capable of forming a uniform silicide layer at the bottom of a narrow contact opening.

21 Claims, 6 Drawing Sheets

FORMATION OF SILICIDED CONTACT BY ION IMPLANTATION

BACKGROUND OF THE INVENTION

1. The Field of the Invention

The present invention relates to methods of forming electrical contacts on silicon substrates of in-process integrated circuit wafers. More particularly, the present invention is directed to a method of forming an electrical contact including a diffusion barrier formed by metal ion implantation, the electrical contact being formed on a silicon substrate of an in-process integrated circuit wafer.

2. The Relevant Technology

Recent advances in computer technology and in electronics in general are attributable to a great degree to the progress achieved by the integrated circuit industry in electronic circuit integration and miniaturization. This progress has resulted in increasingly compact and efficient semiconductor devices, attended by an increase in the complexity and number of such devices aggregated on a single integrated circuit wafer. The smaller and more complex devices, including resistors, capacitors, diodes, and transistors, have been achieved, in part, by reducing device sizes and spacing and by reducing the junction depth of active regions formed on the silicon substrate of integrated circuit wafers. The smaller and more complex devices have also been achieved by stacking the devices at various levels on the wafer.

Among the features which are being reduced in size are the electrical contacts through which electrical communication is made between discrete semiconductor devices on the varying levels of the wafer. In order to continue in the process of reducing integrated circuit size, however, new methods of forming electrical contacts which overcome certain problems existing in the art are required.

As an example of the problems currently encountered in forming electrical contacts electrical contacts have historically been formed from aluminum or aluminum alloy metallization. Aluminum, however, presents the problem of spiking. Spiking results in the dissolution of silicon from active regions of the semiconductor devices into the aluminum metallization and the dissolution of aluminum into the active regions.

Electrical contacts have more recently been metallized with tungsten with the formation of what is known as a "tungsten plug." The tungsten plug formation process does not incur spiking, but has proven problematic for other reasons, however, and these problems are heightened by the continuous miniaturization of the integrated circuit and the modern "stacked" construction of such circuits.

The tungsten plug is typically deposited by chemical vapor deposition (CVD) in an atmosphere of fluorine, which attacks silicon, creating "worm holes" into the active region. Worm holes formed from this reaction can extend completely through the active region, thereby shorting it out and causing the device to fail. As a further problem associated with the tungsten plug structure of the prior art, the tungsten metallization complicates the electrical contact formation process because it does not adhere well directly to silicon or oxide.

In order to eliminate the problems associated with the reaction between the silicon substrate and the metallization material, prior art methods have typically employed a diffusion barrier structure that is provided between the metallization material and the active region. The diffusion barrier prevents the inter diffusion of silicon of the active region and aluminum of the metallization material. It also provides a surface to which the tungsten will adhere and prevents fluorine from diffusing into the active region.

Prior art FIGS. 1 through 4 of the accompanying drawings depict one conventional method known in the art of forming contact structures having a diffusion barrier. As shown in FIG. 1, a contact opening 16 is first etched through an insulating layer 14 overlying an active region 12 on a silicon substrate 10. Active region 12 typically comprises a doped silicon region such as a source or a drain of a MOS transistor. Insulating layer 14 typically comprises a passivation layer of intentionally formed silicon dioxide or borophosphosilicate glass (BPSG). Contact opening 16 provides a route for electrical communication for active region 12 through the surface of insulating layer 14. As shown in FIG. 2, a titanium layer 20 is sputtered over contact opening 16 in a further step, and coats the exposed surface of active region 12.

A high temperature anneal step is then conducted in an atmosphere of predominantly nitrogen gas ($N_2$). Titanium layer 20 reacts with the silicon of active region 12 during the anneal and is transformed into a dual layer. In forming the new dual layer, the lower portion of titanium layer 20 overlying active region 12 reacts with a portion of the silicon in active region 12 to form a titanium silicide ($TiSi_x$) region 22. Concurrently, the upper portion of titanium layer 20 reacts with the nitrogen gas to form a titanium nitride ($TiN_x$) layer 24. The resulting structure is shown in FIG. 3. Titanium silicide layer 22 provides a conductive interface at the surface of active region 12. Titanium nitride layer 24 formed above titanium silicide layer 22 acts as a diffusion barrier to the interdiffusion of tungsten and silicon, or to the interdiffusion of aluminum and silicon, as mentioned above.

Titanium nitride layer 24 can also be formed with chemical vapor deposition. A typical chemical vapor deposition process comprises the use of a precursor such as a metal organic or a halide, which is thermally decomposed, reacted with a gas such as $NH_3$, or plasma-assist deposited.

The next step, shown in FIG. 4, is the deposition of the metallization layer. In tungsten plug formation, metallization is achieved by the chemical vapor deposition of tungsten to form metallization layer 25. Titanium nitride layer 24 helps improve the adhesion between the walls of the opening and the tungsten metallization material. It also acts as a barrier against the diffusion of metallization layer 25 into the active region 12, and vice-versa.

Another function of depositing titanium layer 20 in contact opening 16 is to remove native silicon dioxide ($SiO_2$) which forms whenever the in-process integrated circuit wafer is exposed to oxygen, such as by way exposure to ambient air. Typical native silicon dioxide layers have a thickness of about 20 Angstroms. Such a native silicon dioxide layer 15 is shown in FIG. 1. Native silicon dioxide layer 15 is highly insulative and can cause a high contact resistance so as to result in failure of the device being formed. Titanium layer 20 of FIG. 2 reacts with and breaks down silicon dioxide layer 15. In the process, a portion of titanium layer 20 is consumed. As a result, titanium layer 20 must be deposited in contact opening 16 in sufficient thickness to react with native oxide layer 15 and to also form an effective diffusion barrier.

One problem involved with the titanium silicide diffusion barrier structure is the poor step coverage provided by current titanium deposition methods. FIG. 5 depicts the results of a typical attempt to deposit titanium with a sufficient thickness in a high aspect ratio contact opening.

Note the cusping 26 or "bread loafing" of titanium on the surface of contact opening 16. A result of cusping 26 is that contact opening 16 is eventually closed off, and cannot be completely filled. Thus, a void area, known as a "keyhole," 28 is formed. Keyhole 28 increases the contact resistance of the electrical contact being formed, resulting in slower device performance. This is ultimately a failure condition of the integrated circuit. Also, keyhole 28 can open up during later processing steps and allow caustic materials inside, which will erode contact opening 16. This is also a failure condition.

A further problem of prior art methods involves the migration of the integrated circuit industry toward high aspect ratios. As device dimensions continue to shrink and the contact openings become deeper and narrower, contact walls become vertical, and current metal deposition techniques fail to provide the necessary step coverage to create adequate contact with underlying active regions. Accordingly, it becomes increasingly difficult to produce a uniform titanium layer at the bottom of the contact opening of sufficient thickness for forming the titanium silicide diffusion barrier.

FIG. 1 shows the dimensions used to calculate the aspect ratio, which is the ratio of the height H to the width W. In order to introduce a sufficiently thick layer of titanium to create an effective diffusion barrier, the aspect ratio of contact openings in the prior art are typically kept relatively low, generally under 2 to 1. This aspect ratio limitation presents a hinderance to current miniaturization efforts.

A further problem associated with high aspect ratios in tungsten plug and titanium nitride layer formation is the formation of a uniform layer of titanium at the bottom of contact opening 16 seen in FIG. 1. The sputtered titanium has a generally angular trajectory that coats the sidewalls and surface of contact opening 16, but is incapable of forming a uniform layer of titanium 20 in the bottom of contact opening 16, particularly in the far corners 17 of contact opening 16. Without this uniform layer, it is very difficult to sufficiently form the diffusion barrier of titanium silicide. The result is high contact resistance and even device failure when aspect ratios are increased beyond about 2 to 1.

The contact opening aspect ratio is expected to continue increase over the next several generations of processes. Aspect ratios of 10 to 1 could become common. In the absence of a solution, the formation of a low resistive contact will become increasingly problematic.

In order to increase the amount of titanium at the bottom of the contact opening, collimated sputtering is currently used for depositing titanium in high aspect ratio contacts. This technology has several limitations, however, in the form of a very low throughput, poor cleanliness, and the necessity of frequent collimator changes. Also, only a fraction of the metal deposited on the top of the contact opening actually reaches the bottom with collimator sputtering. In current processes, the sputtered titanium still does not fully coat the corners of the contact, requiring additional materials such as titanium nitride to be deposited over the top of the titanium. In addition, a tungsten deposition having a thickness of several thousand Angstroms, which is necessary to achieve sufficient coverage on the bottom of contact opening 16, still continues to cause cusping 26 at the top of contact opening 16 so as to reduce the contact opening size and make subsequent CVD depositions of tungsten or other metallization materials more difficult. Collimated sputtering is predicted to be less effective for future high aspect ratio processes because of these limitations, and will ultimately become unusable.

Thus, it is apparent that an electrical contact and a corresponding method for forming the electrical contact are needed which overcome the problems existing in the prior art. Specifically, an electrical contact is needed which can form a sufficient diffusion barrier, and which adheres well to oxide sidewalls. A method of forming the electrical contact is also needed which can be used with high aspect ratio contact openings, which can provide uniform step coverage over the contact openings, and which will sufficiently deposit titanium into remote corners of the contact openings for forming a uniform metal silicide diffusion barrier over underlying active regions.

SUMMARY AND OBJECTS OF THE INVENTION

The present invention seeks to resolve the above and other problems which have been experienced in the art. More particularly, the present invention constitutes an advancement in the art by providing a method for forming an electrical contact on an inprocess integrated circuit wafer which achieves each of the objects listed below.

It is an object of the present invention to provide a method for forming an electrical contact capable of utilizing a high aspect ratio of greater than about 4 to 1.

It is also an object of the present invention to provide such a method which results in a uniform metal silicide layer in the bottom of the contact opening, including in remote corners.

It is another object of the present invention to provide such a method which results in an electrical contact which adheres well to oxide.

It is likewise an object of the present invention to provide such a method which results in an electrical contact which provides a suitable diffusion barrier.

It is another object of the present invention to provide such a method which results in an electrical contact which provides a low contact resistance.

It is a further object of the present invention to provide such a method which is cleaner than the collimated sputtering methods of the prior art.

To achieve the foregoing objects, and in accordance with the invention as embodied and broadly described herein in the preferred embodiment, a method for forming an electrical contact on an in-process integrated circuit wafer is provided. The electrical contact formed thereby is well suited for the use of a tungsten plug. Many of the limitations of the prior art are overcome by the novel method of the present invention for forming the electrical contact.

The resulting electrical contact comprises an underlying layer of titanium silicide, an intermediate layer of titanium nitride, and an upper layer of tungsten. The resulting electrical contact adheres well to oxide sidewalls. Also, step coverage is improved, as the problems of cusping and keyhole formation are overcome by the use of implantation to form the titanium silicide. In addition, an effective diffusion barrier as well as low contact resistance are provided by the electrical contact.

The first step of the method of the present invention in one embodiment comprises providing a silicon substrate on an in-process integrated circuit wafer. Next, a film is formed on the silicon substrate and typically comprises an insulating layer such as borophosphosilicate glass (BPSG). Underneath the insulating layer is typically formed an active region for electrical communication with a transistor gate or capacitor plate. The insulating layer is then patterned with photoresist and etched to form the contact opening.

The next step of the present invention comprises implanting metal ions into the bottom of the contact opening. The metal ions preferably comprise titanium and are deposited with a concentration of preferably about $3.3 \times 10^{16}$ to about $6.6 \times 10^{17}$ atoms per square centimeter of silicon. Implantation allows nearly 100% of the sputtered material to reach the bottom of the contact opening, including in the corners. Next, the in-process integrated circuit wafer is annealed in order to react the sputtered titanium with the silicon in the active region to form a titanium silicide layer of a thickness preferably of about 300 Angstroms. Also, the active region is returned to its prior crystalline state by the anneal. In a further step, a layer of titanium nitride is formed over the surface of the contact opening. The titanium nitride is preferably deposited by first sputter depositing a layer of titanium into the contact opening and then performing a second anneal of the in-process integrated circuit wafer. The second anneal is conducted in an atmosphere of nitrogen to form a titanium nitride layer. Finally, the remainder of the contact opening is metallized, preferably by CVD deposition of tungsten into the remainder of the contact opening.

In an alternative embodiment, the contact opening can be used to form a self-aligned contact. When forming a self-aligned contact, the step of forming a contact opening further comprises forming a dual gate structure over an active region on the silicon substrate, with an aperture formed in the center of the dual gate structure over the active region. Next, a layer of silicon nitride is deposited over the dual gate structure. The silicon nitride layer fully covers the gate structure, including a side covering of silicon nitride which is formed at the edges of the aperture. Next, an insulating layer such as BPSG is formed over the silicon nitride layer and the aperture. The insulating layer is planarized, and the contact opening is etched through the insulating layer, exposing the aperture and extending down to an underlying active region.

When using the present invention with a self-aligned contact, a very narrow aperture can be utilized, as the implantation of titanium effectively reaches the far corners of the aperture and forms an effective silicide region at the bottom thereof.

Thus, it can be seen from the above discussion that a method is provided with which an electrical contact is formed that has high adhesion to the sidewalls of the insulating layer. Furthermore, a suitable metal silicide diffusion barrier is formed that has a low resistive interface. Additionally, the electrical contact can be formed to have a high aspect ratio and when so doing, an evenly distributed metal silicide layer can be formed at the bottom thereof.

BRIEF DESCRIPTION OF THE DRAWINGS

In order that the manner in which the above-recited and other advantages and objects of the invention are obtained will be understood, a more particular description of the invention briefly described above will be rendered by reference to specific embodiments thereof which is illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
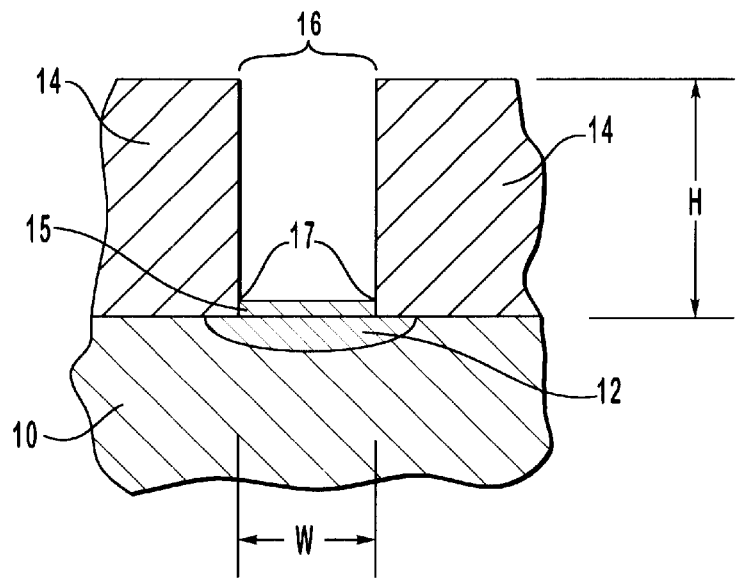
FIG. 1 is schematic cross-sectional representation of a contact opening of the prior art on an in-process integrated circuit wafer showing the relative dimensions for calculating the aspect ratio.
Figure 2:
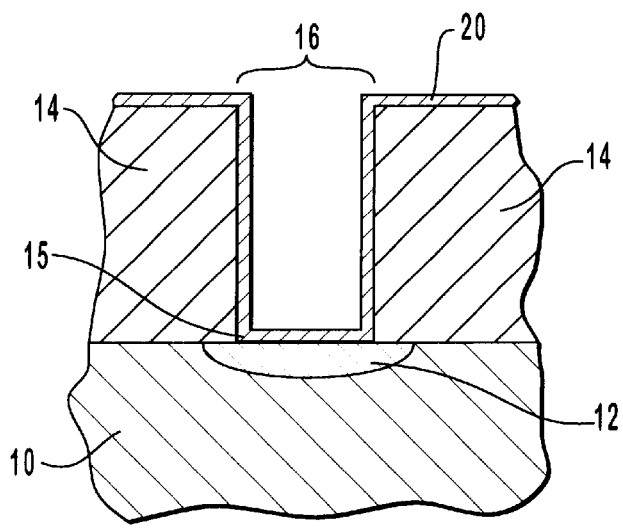
FIG. 2 is schematic cross-sectional representation of a step of a prior art method for forming electrical contacts, which comprises depositing a uniform titanium layer in the bottom of the contact opening.
Figure 3:
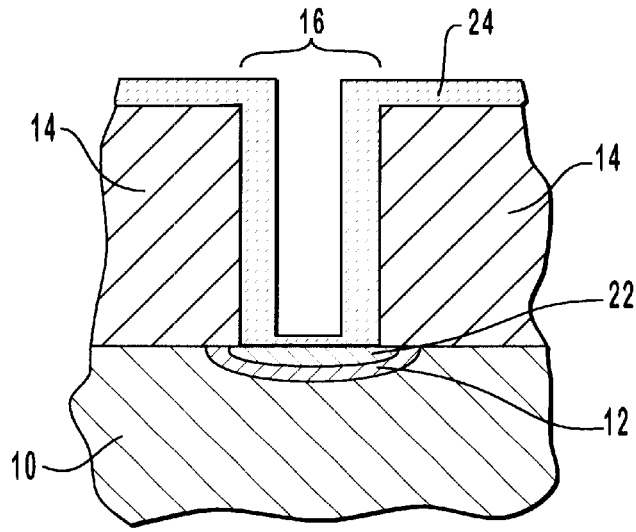
FIG. 3 is a schematic cross-sectional representation of the prior art method of FIG. 2 depicting the results of a further step of annealing the contact opening.
Figure 4:
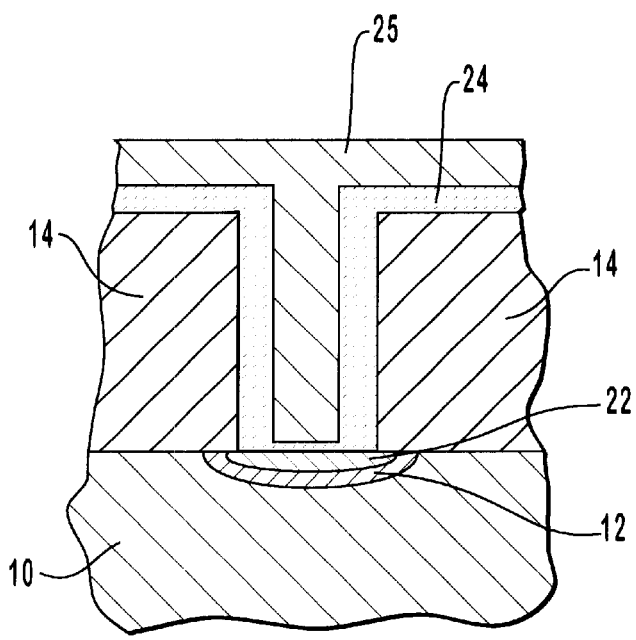
FIG. 4 is a schematic cross-sectional representation of the prior art method of FIG. 3 showing the results of a further step of depositing a titanium metal plug into the remainder of the contact opening.
Figure 5:
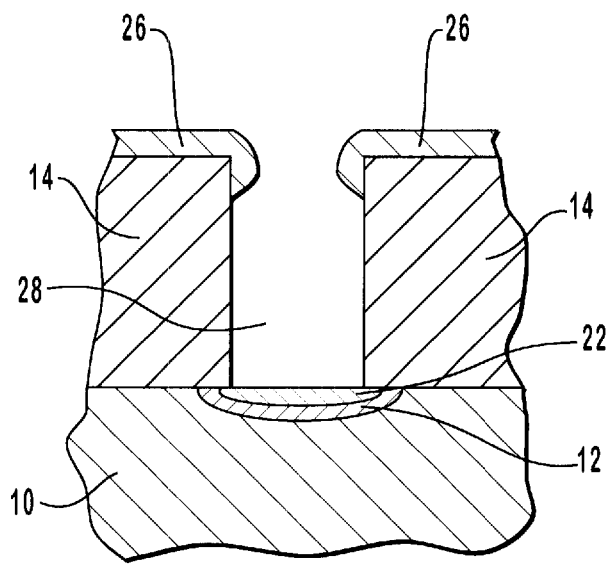
FIG. 5 is a schematic cross-sectional representation of the prior art method illustrating the problems of cusping and keyhole formation.
Figure 6:
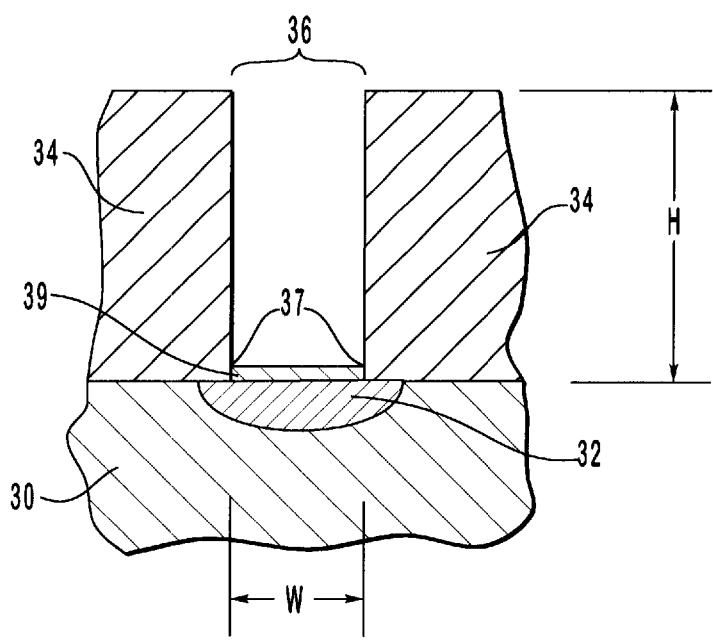
FIG. 6 is a schematic cross-sectional representation of a step of the method of the present invention of etching a contact opening.
Figure 7:
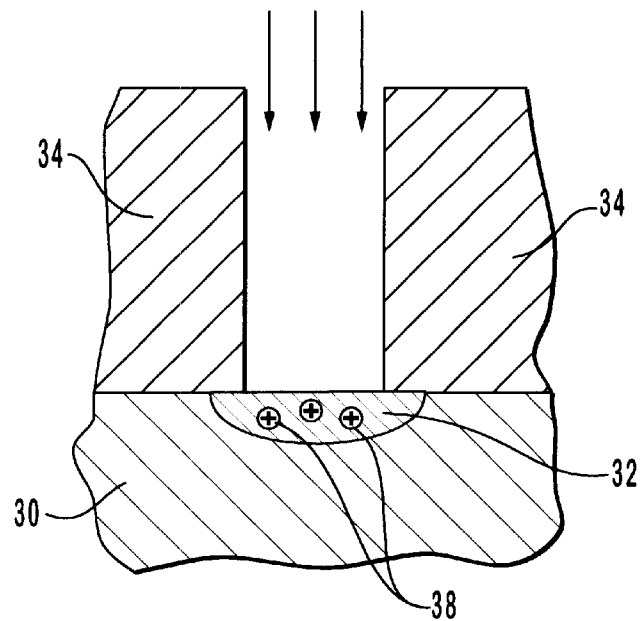
FIG. 7 is a schematic cross-sectional representation of a step of the method of the present invention of metal ion implantation.

FIG. 6 illustrates the first step in the method of the present invention of providing a silicon substrate. In FIG. 6 is shown a silicon substrate 30 on an in-process integrated circuit wafer. An active region 32 such as a doped region or other component of an active device is formed on the surface of silicon substrate 30. An insulating layer 34 such as silicon dioxide ($SiO_2$) or BPSG is formed over active region 32 and silicon substrate 30. Insulating layer 34 is planarized in another step of the method of the present invention, and a contact opening 36 is etched into insulating layer 34. Contact opening 36 is preferably formed with a high aspect ratio, preferably greater than about 2 to 1. More preferably, contact opening 16 has an aspect ratio of greater than about 4 to 1, and most preferably contact opening 16 has an aspect ratio in the range of between about 4 to 1 and about 5 to 1.

In a further step, a metal silicide region is formed at the bottom of contact opening 36 by implanting metal ions 38 with ion implantation. Preferably, a metal silicide layer is formed with a thickness of about 300 Angstroms. To do so, metal ions 38 are implanted with a concentration in a range of between about $3.3 \times 10^{16}$ to about $6.6 \times 10^{16}$ ions per square centimeter of silicon in active region 32. To form a metal silicide layer with a thickness of about 100 Angstroms, as is currently attainable by conventional methods, metal ions 38 are implanted with a concentration of between about $1 \times 10^{16}$ and about $2 \times 10^{16}$ ions per square centimeter.

The dosages so described are practical and are in reach of the current technology. While conventional production implanters were previously limited to dosages of about $1\times10^{16}$, capabilities of up to $1\times10^{18}$ ions per square centimeter are becoming available. For instance, the conventional technology of SIMOX SOI is capable of implantation concentrations of up to $1\times10^{18}$. Also, plasma immersion implantation is becoming available and is also allowing high doses to become practical.

In one embodiment given by way of example, the ion implantation process is conducted in an implantation machine such as the Eaton Nova implanter, manufactured by Eaton Manufacturing, Inc., located in the city of Austin, in the state of Texas, USA. During the implantation, the silicon substrate is typically maintained below the temperature at which dynamic recrystallization of silicon occurs. Thus, the temperature is typically maintained at below about 200° C. and preferably below about 100° C. The ion energy is typically low, below about 100 KeV and even below about 50 KeV, selected such that the implanted ions are concentrated near the surface of active region 32. A dose of about $1\times10^{16}$ to $1\times10^{18}$ ions per square centimeter is typically used in the ion implantation process.

In the preferred embodiment, titanium is implanted from a source gas having a mixture and concentrations such as about 10% $TiCl_4$ with about 90% Argon. The titanium is ionized and accelerated toward the wafer using conventional implantation techniques whereby the accelerated titanium ions are separated from the source gas with a method such as a slit formed in a screening wall and set at the proper elevation in the trajectory of the accelerated ions such that only the titanium ions are allowed through, while other ions having different weights and different trajectories are stopped by the screening wall. Titanium ions 38 impact the surface of the in-process integrated circuit wafer at a substantially normal angle, and are implanted into the bottom of contact opening 36 and, in particular, into the comers 37 of contact opening 36 without being deposited on the sidewalls or forming cusps on the surface of contact opening 36. Thus, nearly 100% of the metal reaches the bottom of the contact opening, including the corners, and an even dosage of implanted metal ions 38 is located at or near the surface of active region 32.

Figure 8:
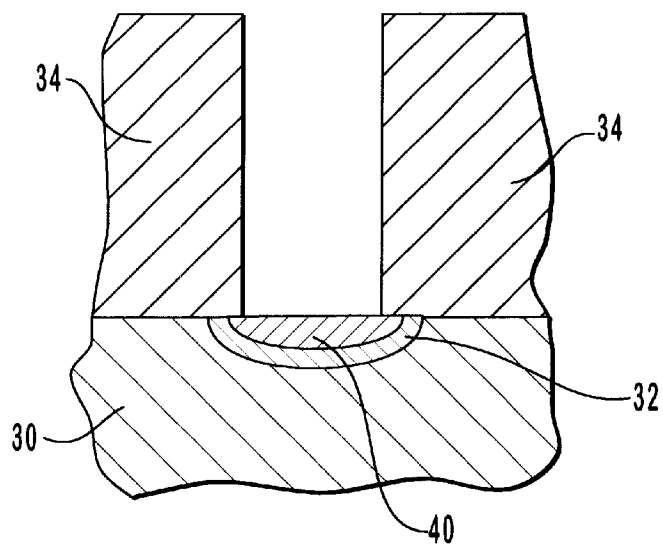
FIG. 8 is a schematic cross-sectional representation of the method of the present invention showing a further step of annealing the implanted ions to form a metal silicide layer.

The next step of the present invention comprises annealing the in-process integrated circuit wafer. Preferably, a rapid thermal anneal is conducted at a temperature of about 700–850° C. and for a time period of about 20–30 seconds. Alternatively, the anneal can be conducted at a temperature range of between about 700° C. and about 900° C. and for a time period of about 30 minutes. FIG. 8 shows the results of the anneal step which comprises a metal silicide layer 40 of about 300 Angstroms thick formed above active region 32 in the bottom of contact opening 36. Metal silicide layer 40 forms a sufficient diffusion barrier for prohibiting the interdiffusion of dopants between a metallization material and active region 32. It also forms a conductive interface between the metallization material and active region 32. In the preferred embodiment, the implanted ions comprise titanium ions 38, and metal silicide layer 40 comprises titanium silicide ($TiSi_x$) where x is a variable. More preferably, metal silicide layer 40 comprises $TiSi_2$.

As a consequence of the metal ion implantation and annealing step, a native insulating oxide layer 39, which may have previously formed on the surface of contact opening 36, will be broken up. Native insulating oxide layer 39 is volatilized and removed by the process, and a proper conductive surface is thereby formed at the bottom of the contact opening 36.

Figure 9:
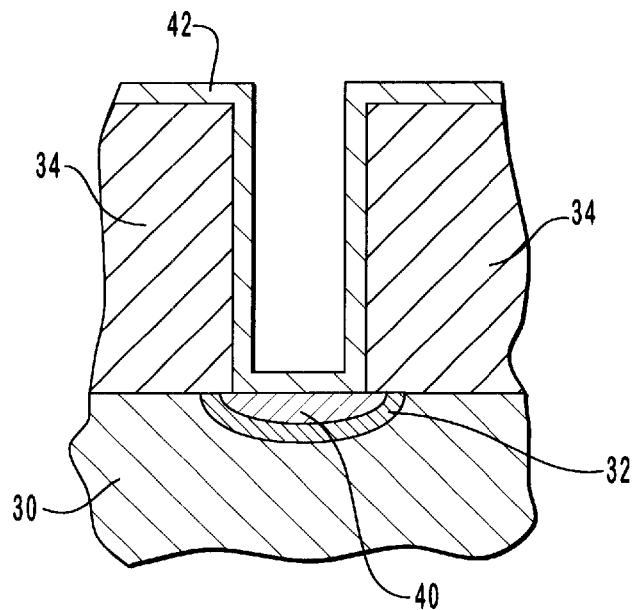
FIG. 9 is a schematic cross-sectional representation of the method of the present invention showing a further step of depositing a uniform titanium layer over the surface of the contact opening

In a further step, illustrated in FIG. 9, a titanium layer 42 is formed over contact opening 36 and metal silicide layer 40. Titanium layer 42 is preferably formed by first sputter depositing titanium over the surface of contact opening 36 with a thickness of about 500 Angstroms. Next, an anneal is conducted at a temperature of about 800° C . The anneal is conducted in a nitrogen atmosphere having a concentration of about 100% and results in titanium nitride layer 44 of FIG. 10 having a thickness preferably of about 500 Angstroms.

Alternatively, titanium nitride layer 44 can be formed with chemical vapor deposition of titanium nitride. When so doing, titanium nitride layer 44 is formed with a thickness of about 200 angstroms. Titanium nitride layer 44 increases the thickness of the diffusion barrier, and provides an interface on the sidewalls of contact opening 36 to which the metallization material will adhere.

Figure 10:
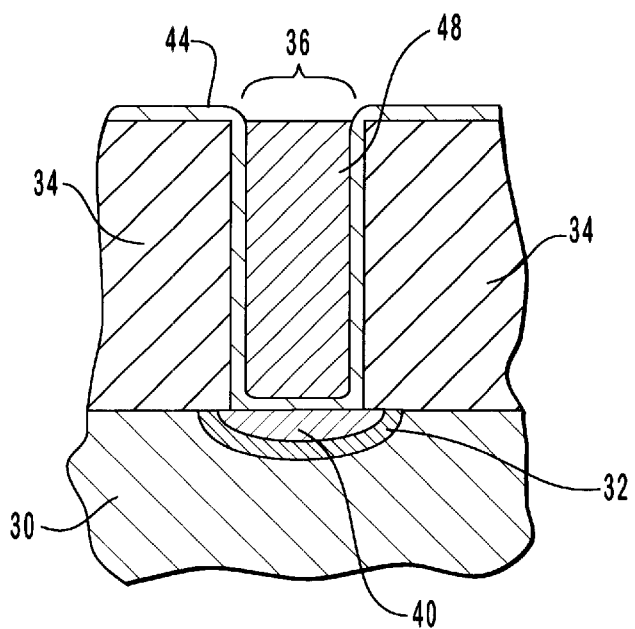
FIG. 10 is a schematic cross-sectional representation of the method of the present invention showing the results of further steps of annealing the electrical contact and depositing a tungsten plug into the remainder of the contact opening.

In a final step, also illustrated in FIG. 10, the center of contact opening 36 is filled with a metallization material. Preferably, this metallization material comprises a tungsten plug 48 which is deposited by chemical vapor deposition. Thus, an electrical contact is formed which adheres well to oxide due to the formation of titanium nitride layer 44 and which incorporates a suitable diffusion barrier in the form of metal silicide layer 40. The tungsten metallization adheres well to the titanium nitride and consequently maintains the integrity of the electrical contact. Also, because of the titanium silicide, low contact resistance is maintained.

The method of the present invention can be used to form any type of electrical contact on a silicon substrate, and will be highly beneficial in replacing conventional contacts, plugs, and vias as aspect ratios are increased. The electrical contact formed by the method of the present invention will be especially beneficial in replacing the tungsten plug structure of the prior art.

It is possible that metal ions implanted into insulating layer 34 surrounding the contact openings could be conductive and cause leakage of current. It is predicted, however, that the slight level of implantation being used will not be detected electrically, particularly since there is no silicon for a silicide reaction. If the implanted metal is implanted in sufficient concentrations to cause a leakage problem, it is a further step of the present invention to remove the implanted metal from insulating layer 34 during subsequent processing. As the preferred energy of the implant is low so that the metal ions are only present in a thin surface layer of about 500 Angstroms, removal of this layer could be accomplished in several ways. In one embodiment, the ions implanted into insulating layer 34 are removed during Tungsten CMP or plasma etchback. A hydrochloric acid dip could also be used to remove the layer. Also, when conducting the metal etch to pattern interconnect structures on the surface of the in process integrated circuit wafer, the metal etch typically cuts into the oxide so as to remove a significant amount thereof.

Figure 11:
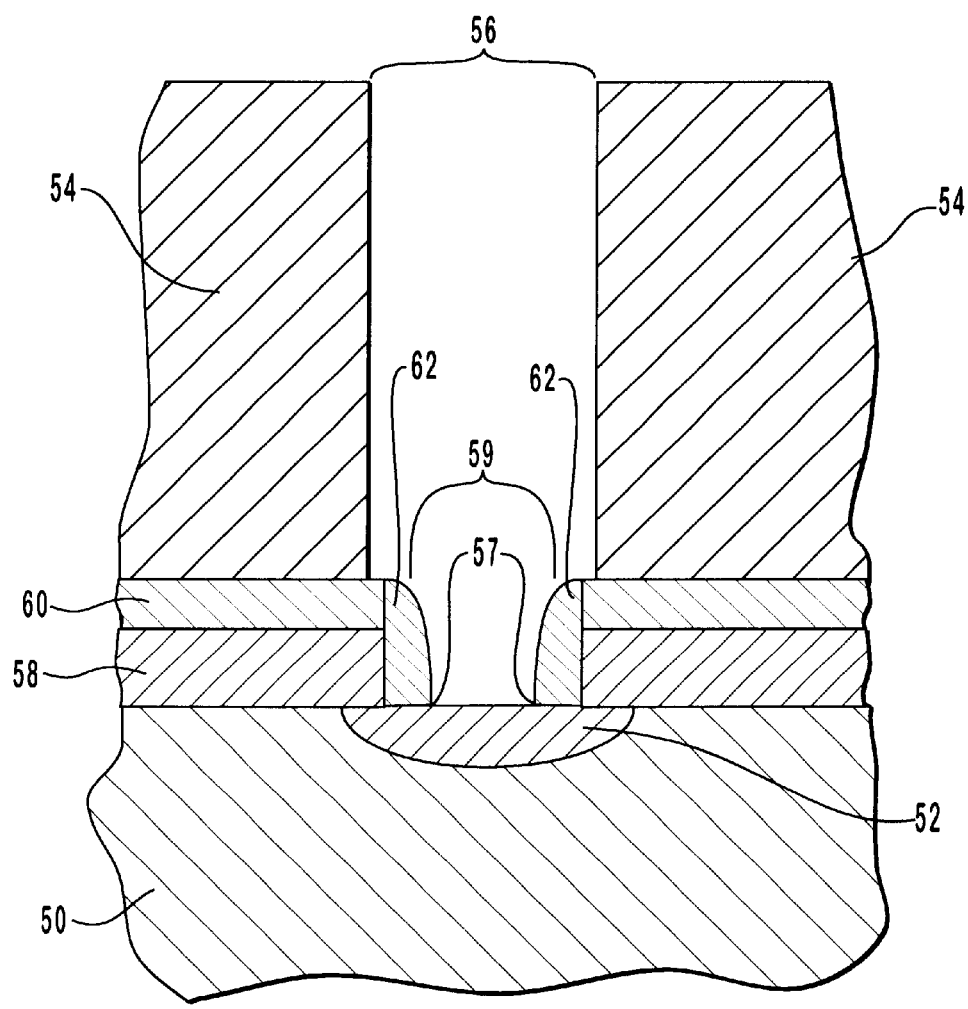
FIG. 11 is a schematic cross-sectional representation of an alternative embodiment of the method of the present invention comprising forming a self aligned contact.

In an alternate embodiment, the present invention could be used in the formation of a self-aligned contact In so doing, the step of forming a contact opening will further comprise the following steps. First, a dual gate structure 58 seen in FIG. 11 is formed over an active region 52 on the silicon substrate 50. Dual gate structure 58 is formed to have an aperture 59 in the center thereof. Next, a layer of silicon nitride 60 is formed over dual gate structure 50. Silicon nitride layer 60 also partially enters into aperture 59 with a side covering 62 and fully encloses and insulates dual gate structure 58. Next, an insulating layer 54 is formed over silicon nitride layer 60 and aperture 59. Insulating layer 54 typically comprises BPSG. Next, insulating layer 54 is planarized. Finally, a contact opening 56 is etched through insulating layer 54 extending down to aperture 59, such that underlying active region 52 below aperture 59 is exposed for the formation of an electrical contact which will provide electrical communication to active region 52.

The present invention is particularly advantageous for the formation of self-aligned contacts because aperture 59 at the bottom of contact opening 56 is quite narrow, typically comprising about 0.1 to 0.2 microns, and has corners 57 which conventional processes have a difficult time in evenly covering with titanium to form a diffusion barrier such a metal silicide layer. The metal ion implantation of the present invention is capable of forming an even titanium deposition at the bottom of aperture 59, such that upon annealing a consistent metal silicide region is formed. Thus, self-aligned contact openings and other contact openings having high aspect ratios are capable of being formed with the method of the present invention.

From the above discussion, it can be seen that a method is provided by the present invention wherein an electrical contact is formed which adheres well to the oxide sidewalls of the contact opening. Furthermore, a suitable diffusion barrier is formed such that a low resistive interface which prohibits the interdiffusion of dopants is also formed. The electrical contact can be formed with a high aspect ratio, and when so doing an evenly distributed metal silicide layer can be formed in the bottom thereof.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming an electrical contact on a silicon substrate the method comprising the steps of:

providing a silicon substrate;

forming a dual gate structure on the silicon substrate with an aperture in the dual gate structure;

forming a layer of silicon nitride over the dual gate structure, the silicon nitride layer entering into the aperture and substantially insulating the dual gate structure from the aperture;

forming an insulating layer over the silicon nitride layer and the aperture;

planarizing the insulating layer;

forming a contact opening through the insulating layer to the silicon substrate, the contact opening including at least a portion of the aperture, the contact opening having a bottom and an aspect ratio greater than about 4 to 1;

implanting metal ions into the contact opening; and annealing the silicon substrate at a temperature and for a time sufficient to result in the formation of a metal silicide layer of substantially uniform thickness in the bottom of the contact opening, the metal silicide layer including the implanted metal ions wherein the step of forming the contact opening comprises patterning the insulating layer, the patterned insulating having a surface around the contact opening, and after the step of implanting metal ions, removing a surface layer of the patterned insulating layer where the metal ions are present to remove the metal ions that are implanted into the surface of the patterned insulating layer around the contact opening during the step of implanting metal ions into the contact opening.

2. A method as recited in claim 1, further comprising a step subsequent to the step of annealing the silicon substrate of forming a titanium nitride layer above the metal silicide layer.

3. A method as recited in claim 2, wherein the titanium nitride layer is formed by the steps of:

sputtering a layer of titanium in the contact opening over the metal silicide layer; and annealing the silicon substrate in an atmosphere of nitrogen.

4. A method as recited in claim 2, wherein the titanium nitride layer is formed by the chemical vapor deposition of titanium nitride.

5. A method as recited in claim 2, further comprising the step of depositing a metal into the remainder of the contact opening.

6. A method as recited in claim 5, wherein the metal deposited into the remainder of the contact opening comprises a tungsten plug.

7. A method as recited in claim 1, wherein the contact opening has an aspect ratio in a range of between about 4 to 1 and about 5 to 1.

8. A method as recited in claim 1, wherein the bottom of the contact opening has a layer of native oxide thereon that is removed therefrom by said steps of implanting metal ions and annealing the silicon substrate.

9. A method as recited in claim 1, wherein the metal ions are implanted with a concentration range of about $1 \times 10^{16}$ to about $7 \times 10^{16}$ metal atoms per cubic centimeter of silicon.

10. A method as recited in claim 9, wherein the metal silicide layer formed at the bottom of the contact opening has a thickness in a range of between about 50 to about 300 Angstroms.

11. A method as recited in claim 1, wherein the step of implantation is conducted with plasma immersion implantation.

12. A method as recited in claim 1, wherein the bottom of the contact opening has corners, and wherein the metal silicide layer is formed in the bottom of the contact opening and substantially covers the corners of the bottom of the contact opening.

13. A method as recited in claim 1, wherein the step of implanting metal ions further comprises implanting titanium ions, and wherein the metal silicide layer formed by the step of annealing comprises titanium silicide.

14. A method as recited in claim 1, wherein the metal ions that are implanted into the surface of the patterned insulating layer are removed by etching the patterned insulating layer with an isotropic etch.

15. A method as recited in claim 14, wherein the aperture has corners, and wherein the metal silicide layer is formed in the bottom of the aperture and substantially covers the corners of the aperture.

16. A method as recited in claim 15, further comprising:

forming a titanium nitride layer over the metal silicide layer in the contact opening, the titanium nitride layer substantially coating the contact opening; and filling the remainder of the contact opening with a metal, wherein the metal in the remainder of the contact opening comprises tungsten.

17. A method as recited in claim 15, further comprising:

forming a titanium nitride layer over the metal silicide layer in the contact opening with chemical deposition of titanium nitride, the titanium nitride layer substantially coating the contact opening; and filling the remainder of the contact opening with a metal, wherein the metal in the remainder of the contact opening comprises tungsten.

18. A method as recited in claim 14, further comprising;

forming a titanium nitride layer over the metal silicide layer in the contact opening, the titanium nitride layer substantially coating the contact opening; and filling the remainder of the contact opening with a metal.

19. A method as recited in claim 18, wherein the metal in the remainder of the contact opening comprises a tungsten plug.

20. A method as recited in claim 1, further comprising:

depositing a tungsten plug into the contact opening after the step of annealing the silicon substrate; and planarizing the tungsten plug and the patterned insulating layer until the metal ions that are implanted into the surface of the patterned insulating layer are removed by.

21. A method as recited in claim 1, wherein the metal ions that are implanted into the surface of the patterned insulating layer are removed with an etch which etches into the patterned insulating layer.

* * * * *

UNITED STATES PATENT AND TRADEMARK OFFICE
CERTIFICATE OF CORRECTION

PATENT NO. : 6,406,998 B1 Page 1 of 1
DATED : June 18, 2002
INVENTOR(S) : Kirk D. Prall and Gurtej S. Sandhu It is certified that error appears in the above-identified patent and that said Letters Patent is hereby corrected as shown below:

Column 1,
Line 67, after "the" change "inter diffusion" to -- interdiffusion --

Column 9,
Line 8, after "has" change "comers" to -- corners --

Column 12,
Line 6, after "are" change "removed" to -- removed. --
Line 7, delete "by."
Line 8, after "the" change "metalions" to -- metal ions --

Signed and Sealed this

Eighteenth Day of February, 2003

JAMES E. ROGAN
*Director of the United States Patent and Trademark Office*